United States Patent
Wu et al.

(10) Patent No.: US 11,854,896 B2
(45) Date of Patent: Dec. 26, 2023

(54) SEMICONDUCTOR DEVICE WITH S/D BOTTOM ISOLATION AND METHODS OF FORMING THE SAME

(71) Applicant: Taiwan Semiconductor Manufacturing Co., Ltd., Hsinchu (TW)

(72) Inventors: Xusheng Wu, Hsinchu County (TW); Ying-Keung Leung, Hsinchu (TW); Huiling Shang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 70 days.

(21) Appl. No.: 17/213,420

(22) Filed: Mar. 26, 2021

(65) Prior Publication Data

US 2022/0310452 A1   Sep. 29, 2022

(51) Int. Cl.
*H01L 21/8234* (2006.01)
*H01L 27/088* (2006.01)
(Continued)

(52) U.S. Cl.
CPC .............. *H01L 21/823418* (2013.01); *H01L 21/823412* (2013.01); *H01L 21/823431* (2013.01);
(Continued)

(58) Field of Classification Search
CPC ..... H01L 21/823412; H01L 21/823418; H01L 21/823431; H01L 21/823814; H01L 21/823821; H01L 27/088; H01L 27/0886; H01L 27/0924; H01L 29/0673; H01L 29/42392; H01L 29/66545; H01L 29/785; H01L 29/7855; H01L 29/78696; H01L 21/823425; H01L 21/823468; H01L 29/0642; H01L 29/0653; H01L 29/0847;
(Continued)

(56) References Cited

U.S. PATENT DOCUMENTS 9,818,872 B2   11/2017   Ching et al.
9,887,269 B2   2/2018    Ching et al.
(Continued)

*Primary Examiner* — Cheung Lee
(74) *Attorney, Agent, or Firm* — HAYNES AND BOONE, LLP

(57) ABSTRACT

Semiconductor device and the manufacturing method thereof are disclosed. An exemplary semiconductor device comprises first semiconductor stack over a substrate, wherein the first semiconductor stack includes first semiconductor layers separated from each other and stacked up along a direction substantially perpendicular to a top surface of the substrate; second semiconductor stack over the substrate, wherein the second semiconductor stack includes second semiconductor layers separated from each other and stacked up along the direction substantially perpendicular to the top surface of the substrate; inner spacers between edge portions of the first semiconductor layers and between edge portions of the second semiconductor layers; and a bulk source/drain (S/D) feature between the first semiconductor stack and the second semiconductor stack, wherein the bulk S/D feature is separated from the substrate by a first air gap, and the bulk S/D feature is separated from the inner spacers by second air gaps.

20 Claims, 14 Drawing Sheets

(51) Int. Cl.
  *H01L 29/786* (2006.01)
  *H01L 29/06* (2006.01)
  *H01L 29/66* (2006.01)
  *H01L 29/423* (2006.01)
  *H01L 29/78* (2006.01)

(52) U.S. Cl.
  CPC ........ *H01L 27/088* (2013.01); *H01L 29/0665* (2013.01); *H01L 29/42392* (2013.01); *H01L 29/66545* (2013.01); *H01L 29/785* (2013.01); *H01L 29/7855* (2013.01); *H01L 29/78696* (2013.01)

(58) Field of Classification Search
  CPC ........... H01L 29/66439; H01L 29/6653; H01L 29/66795; H01L 29/7848; B82Y 10/00; B82Y 40/00
  See application file for complete search history.

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2018/0175036 A1 | 6/2018 | Ching et al. |
| 2020/0052107 A1* | 2/2020 | Lie ................. H01L 27/088 |
| 2020/0381547 A1* | 12/2020 | Song ................. H01L 29/785 |
| 2020/0411667 A1* | 12/2020 | Wong ............... H01L 21/02293 |
| 2021/0375685 A1* | 12/2021 | Xie ................. H01L 21/823418 |

* cited by examiner

SEMICONDUCTOR DEVICE WITH S/D BOTTOM ISOLATION AND METHODS OF FORMING THE SAME

BACKGROUND

The integrated circuit (IC) industry has experienced exponential growth. Multi-gate devices have been introduced to improve gate control by increasing gate-channel coupling and reducing off-state current. One such multi-gate device is a nanosheet device. A nanosheet device substantially refers to any device having a channel region including separated semiconductor channels, and a gate structure, or portions thereof, formed on more than one side of the semiconductor channels (for example, surrounding the semiconductor channels). In some instances, a nanosheet device is also called as a nanowire device, a nanoring device, a gate-surrounding device, a gate-all-around (GAA) device, or a multi-channel bridge device. Nanosheet transistors are compatible with conventional complementary metal-oxide-semiconductor (CMOS) fabrication processes and allow aggressive scaling down of transistors.

However, fabrication of nanosheet transistors presents challenges. For example, in a conventional nanosheet device, the source/drain (S/D) features are epitaxially grown from the substrate and the channel semiconductor layers. A leakage path may occur between the S/D and the substrate which may cause current leakage deep into the substrate. In some embodiments, the S/D features may physically connect the inner spacers surrounding the metal gate. Thus, for a thin inner spacer, a high parasitic capacitance between the S/D features and the metal gate may occur. In addition, compare with the double gate devices (formed by the S/D features, the channel layers and the surrounded metal gate), the bottom single gate device (formed by the bottom portion of the metal gate, the S/D features, and the substrate) may suffer high leakage due to less gate control. Therefore, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
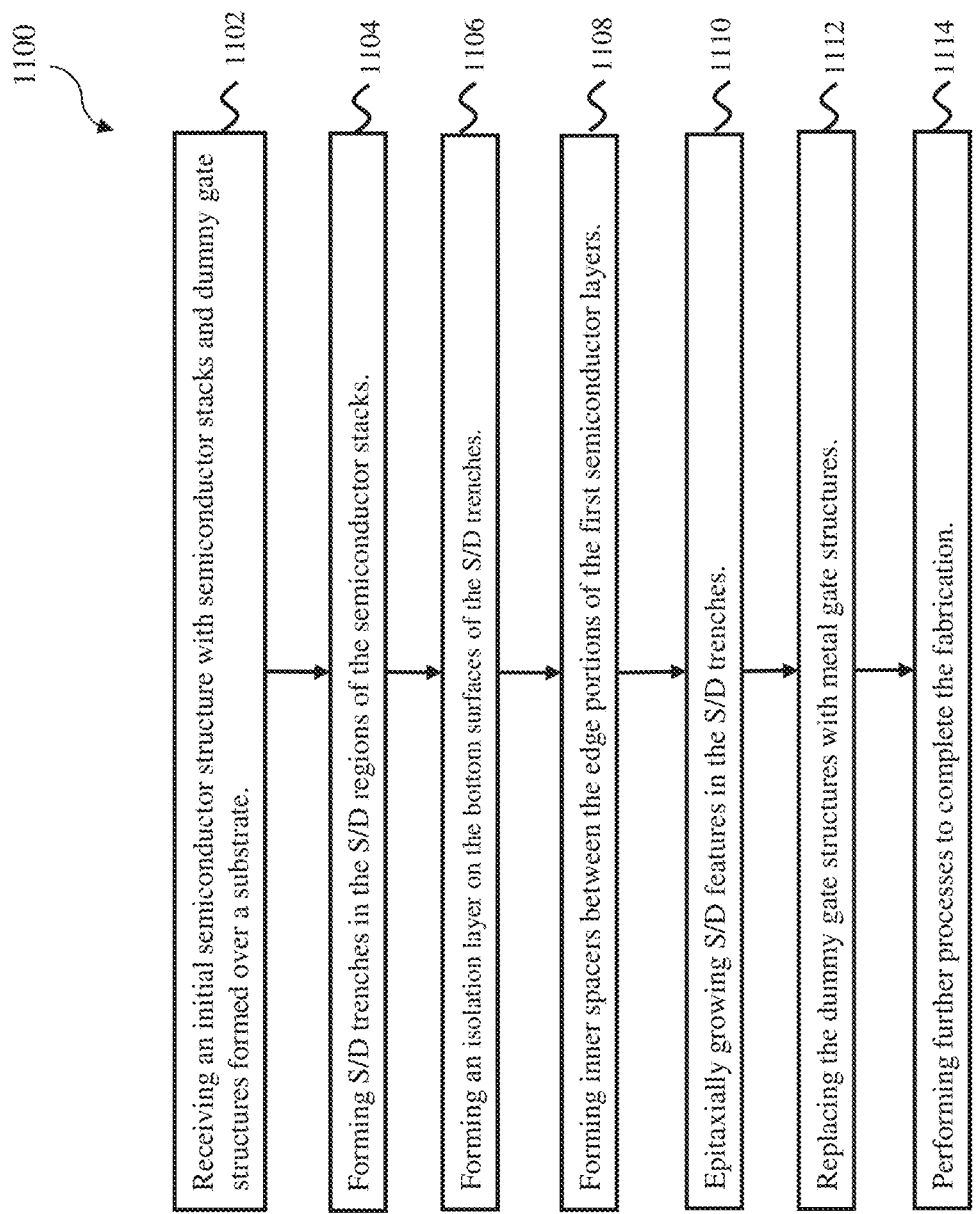
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is substantially related to semiconductor devices and the fabrication thereof, and more particularly to methods of fabricating field-effect transistors (FETs), such as nanosheet FETs.

In a nanosheet device, a channel region of a single device may comprise multiple layers of semiconductor material (also referred to as channel semiconductor layers) physically separated from one another. In some examples, a gate of the device is disposed above, alongside, and even between the semiconductor layers of the device. In a conventional nanosheet device, the S/D feature is not only epitaxially grown from the channel semiconductor layers, but also from the substrate. In other words, the S/D feature directly contacts the substrate, thereby an undesired bulk leakage current Iboff may flows from the S/D to the substrate. In addition, compare with the double gate device (where the channel semiconductor layer is surrounded by the metal gate), the bottom single gate device (where the silicon channel (or the substrate) is only covered by single bottom metal gate portion) is suffered with higher leakage current due to less gate control. In some embodiment, the S/D feature may physically contact the inner spacers around the metal gate which may result in a high parasitic capacitance between the S/D feature and the metal gate. However, in the present disclosure, an isolation layer is formed on the bottom surface of the S/D trench to cover the exposed surface of the substrate. Therefore, the S/D feature is only epitaxially grown from the channel semiconductor layers and is free from the substrate. An air gap is formed between the S/D feature and substrate, which may overcome the S/D Iboff leakage to the substrate and avoid forming the bottom single gate device. In addition, the formation of the S/D feature can be controlled such that air gaps can be formed between the inner spacer and the S/D feature, thereby can reduce the parasitic capacitance between the metal gate and the S/D feature. Therefore, the performance of the semiconductor device is improved.

Figure 2:
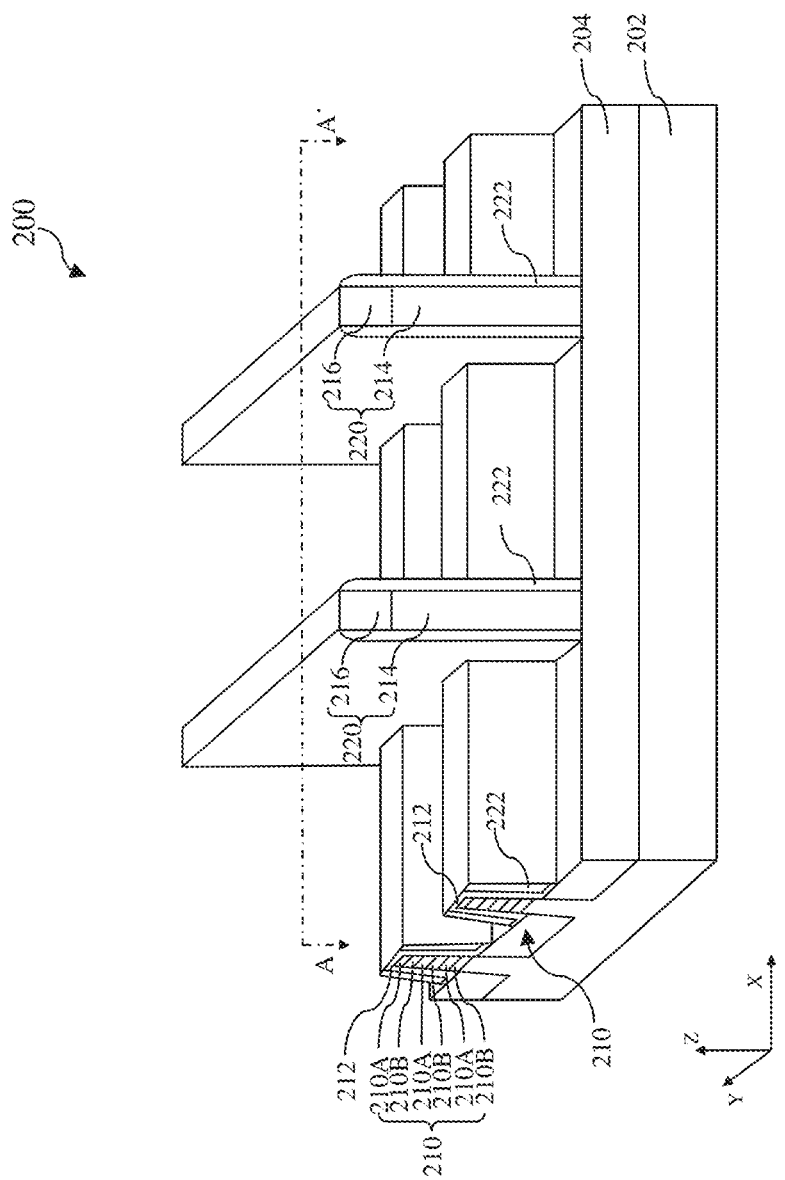
FIG. 2 illustrates a three-dimensional perspective view of the initial example semiconductor device accordance with some embodiments of the present disclosure.

FIG. 1 illustrates a flow chart of a method 1100 for making an example semiconductor device 200 (hereinafter, device 200) in accordance with some embodiments of the present disclosure. Method 1100 is merely an example and is not intended to limit the present disclosure beyond what is explicitly recited in the claims. Additional operations can be performed before, during, and after method 1100, and some operations described can be replaced, eliminated, or moved around for additional embodiments of the method. Method 1100 is described below in conjunction with other figures, which illustrate various three-dimensional and cross-sectional views of the device 200 during intermediate steps of method 1100. In particular, FIG. 2 is a three-dimensional view of an initial structure of device 200 in accordance with some embodiments of the present disclosure. FIGS. 3-14 illustrate cross-sectional views of the device 200 taken along the plane A-A' shown in FIG. 2 (that is, in an X-Z plane) at intermediate stages of the method 1100 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Figure 3:
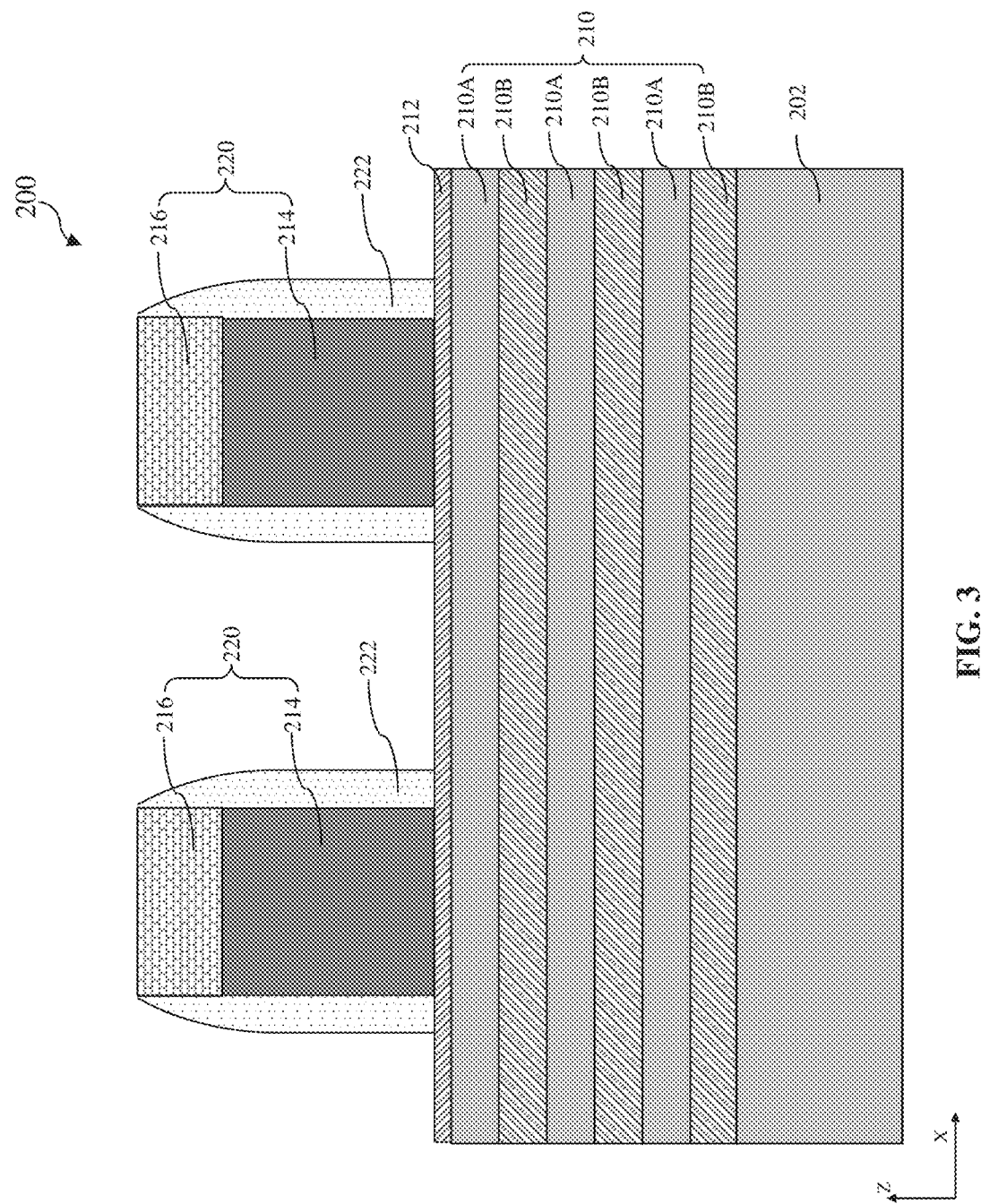
FIGS. 3-14 illustrate cross-sectional views of the semiconductor device along line A-A' in the three-dimensional perspective view at intermediate stages of the method of FIG. 1 in accordance with some embodiments of the present disclosure.

Referring to FIGS. 1, 2, and 3, at operation 1102, an initial semiconductor structure of device 200 is formed. As depicted in FIGS. 2 and 3, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region comprising n-type doped substrate regions (such as n-well) and NFET region comprising p-type doped substrate regions (such as p-well).

The device 200 includes alternating semiconductor layers formed over the substrate 202, such as semiconductor layers 210A including a first semiconductor material and semiconductor layers 210B including a second semiconductor material that is different from the first semiconductor material. The different semiconductor materials of the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, alternating SiGe/Si/SiGe/Si/ . . . layers are arranged from bottom to top. In some embodiments, the material of the top semiconductor layer may or may not be the same as the bottom semiconductor layer. In some embodiments, no intentional doping is performed when forming the semiconductor layers 210A. In some other embodiments, the semiconductor layers 210A may be doped with a p-type dopant or an n-type dopant. The number of the semiconductor layers 210A and 210B depends on the design requirements of device 200. For example, it may comprise one to ten layers of semiconductor layers 210A or 210B each. In some embodiments, different semiconductor layers 210A and 210B have the same thickness in the Z-direction. In some other embodiments, different semiconductor layers 210A and 210B have different thicknesses. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, such as a metal organic CVD (MOCVD) process, and/or other suitable epitaxial growth processes.

Thereafter, the alternating semiconductor layers 210A and 210B are patterned to form semiconductor stacks 210 (hereinafter the stacks 210). In some embodiments, various photoresist lithography and etching processes may be performed to the semiconductor layers 210A and 210B to form the stacks 210 in fin-shapes as illustrated in FIG. 2. For example, a patterned photoresist mask is formed over the device 200. The patterned photoresist mask covers the fin positions according to the design requirement of device 200. Subsequently, one or more etching processes are performed using the patterned photoresist mask to remove the exposed portions of the first and second semiconductor layers 210A and 210B. The remained portions of the first and second semiconductor layers 210A and 210B form the fin-shape stacks 210. In some embodiments, a top portion of the substrate 202 is also removed. The etching process includes dry etching, wet etching, other suitable etching process, or combinations thereof. And, the photoresist mask is then removed using any proper method.

Thereafter, an isolation structure 204 is formed in the trenches between the stacks 210 to separate and isolate the active regions of device 200. In some embodiments, one or more dielectric materials, such as silicon dioxide (SiO) and/or silicon nitride (SiN), is deposited over the substrate 202 along sidewalls of the stack 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 204.

Subsequently, a liner layer 212 is formed over the stacks 210 and the isolation structure 204. In some embodiment, the liner layer 212 includes a dielectric material, such as silicon oxide (SiO), silicon nitride (SiN), other dielectric material, or combinations thereof. The liner layer 212 may be formed by a deposition process, such as CVD, PVD, atomic layer deposition (ALD), other suitable process, or combinations thereof.

Dummy gate structures 220 are then formed over the stacks 210. Each dummy gate structure 220 serves as a placeholder for subsequently forming a metal gate structure. In some embodiments, the dummy gate structures 220 extend along the Y-direction and traverse respective stacks 210. The dummy gate structures 220 cover the channel regions of the stacks 210 which interpose the source regions and the drain regions (both referred to as the S/D regions). Each of the dummy gate structures 220 may include various dummy layers. For example, an interfacial layer (not shown), a dummy gate electrode 214 (for example, including polysilicon), a hard mask layer 216 (for example, including a dielectric material such as SiN, silicon carbonitride (SiCN), SiO, etc.), and/or other suitable layers. The dummy gate structures 220 are formed by deposition processes, lithography processes, etching processes, other suitable processes, or combinations thereof. For example, different dummy gate layers are deposited over the stacks 210. A lithography process is then performed to form a mask covering the channel regions of the stacks 210. Thereafter, the different dummy gate layers are etched using the lithography mask to form the dummy gate structures 220. And, the lithography mask is then removed using any proper method.

Subsequently, gate spacers 222 are formed along sidewalls of the dummy gate structures 220. In some embodiment, the gate spacers 222 are also formed along sidewalls of the stacks 210. In some embodiments, the gate spacers 222 comprises a dielectric material, such as SiO, SiN, silicon oxynitride (SiON), silicon carbide (SiC), other dielectric material, or a combination thereof. The formation of the gate spacers 222 involves various deposition and etching processes. In some embodiments, first, a gate spacer layer is deposited (for example, by ALD, CVD, PVD, or other proper process) over the device 200. Next, an anisotropic etching process is performed to remove the gate spacer layer in the X-Y plane (the plane in which the top surface of the substrate 202 is), while keeping the gate spacer layer along the Z-direction. The remained portions of the gate spacer layer along the Z-direction form the gate spacers 222. The anisotropic etching process includes wet etch, dry etch, or combinations thereof.

Figure 4:
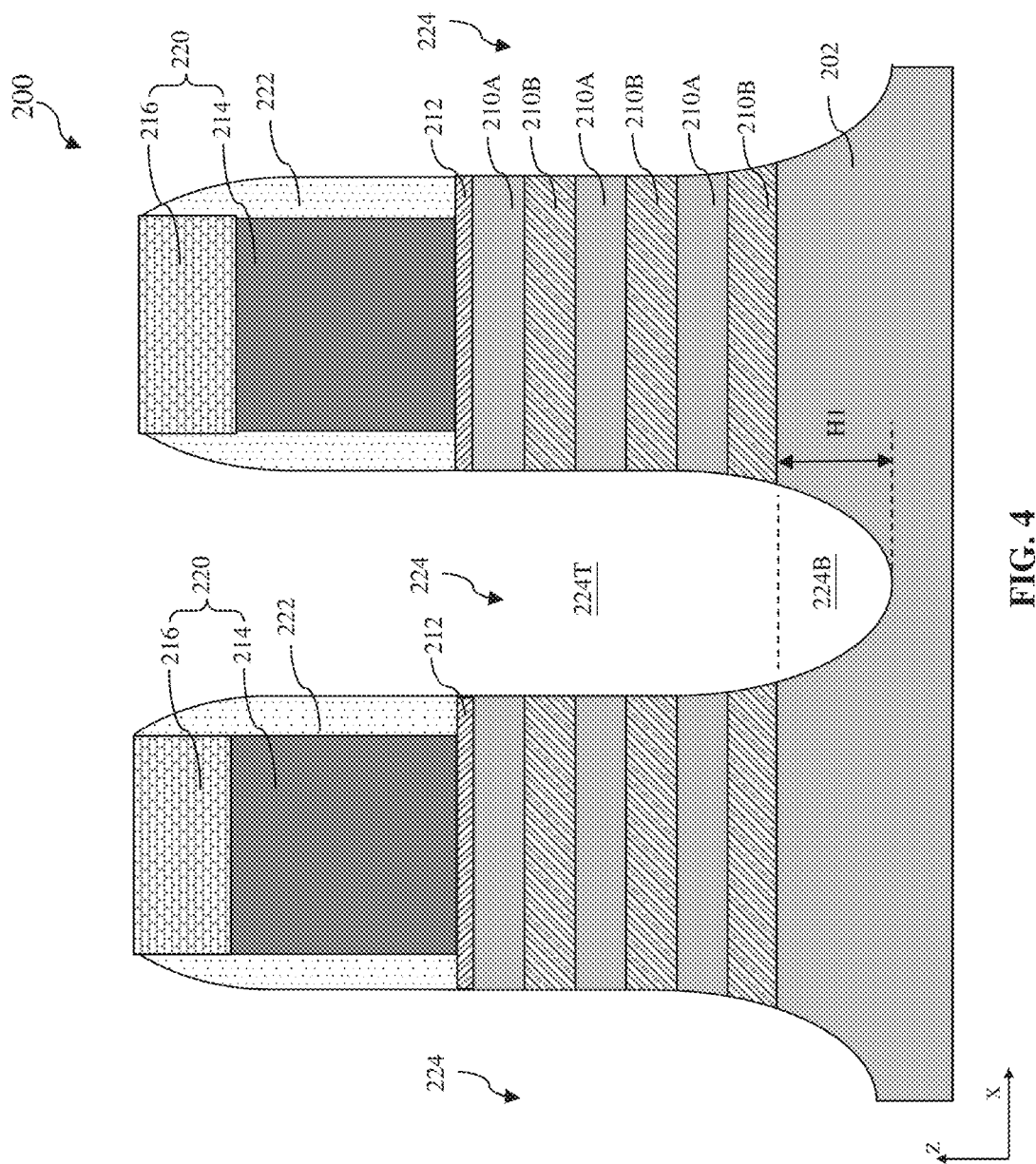

Referring to FIGS. 1 and 4, at operation 1104, S/D trenches 224 are formed in the S/D regions of the stacks 210. In some embodiments, the stacks 210 are recessed by a S/D etching process along sidewalls of the gate spacers 222 to form the S/D trenches 224. The S/D etching process may be a dry etching process (such as a reactive ion etching (RIE) process), a wet etching process, or combinations thereof. The duration of the S/D etching process is controlled such that the sidewalls of each semiconductor layers 210A and 210B are exposed in the S/D trenches 224. In other words, the semiconductor layers 210A and 210B are truncated by the S/D trenches 224. Each semiconductor layer 210A or 210B is separated into two or more corresponding portions. As depicted in FIG. 4, top portions of the substrate 202 in the S/D trenches 224 are also removed, therefore exposed surfaces of the substrate 202 in the S/D trenches 224 form bottom surfaces of the S/D trenches 224. Thus, the S/D trenches 224 includes a top portion 224T above a bottom surface of the lowermost semiconductor layer 210B and a bottom portion 224B below the bottom surface of the lowermost semiconductor layer 210B. In some embodiments, the bottom portion 224B (i.e. the recessed substrate portion in the S/D regions) has a height H1 along the Z-direction.

Figure 5:
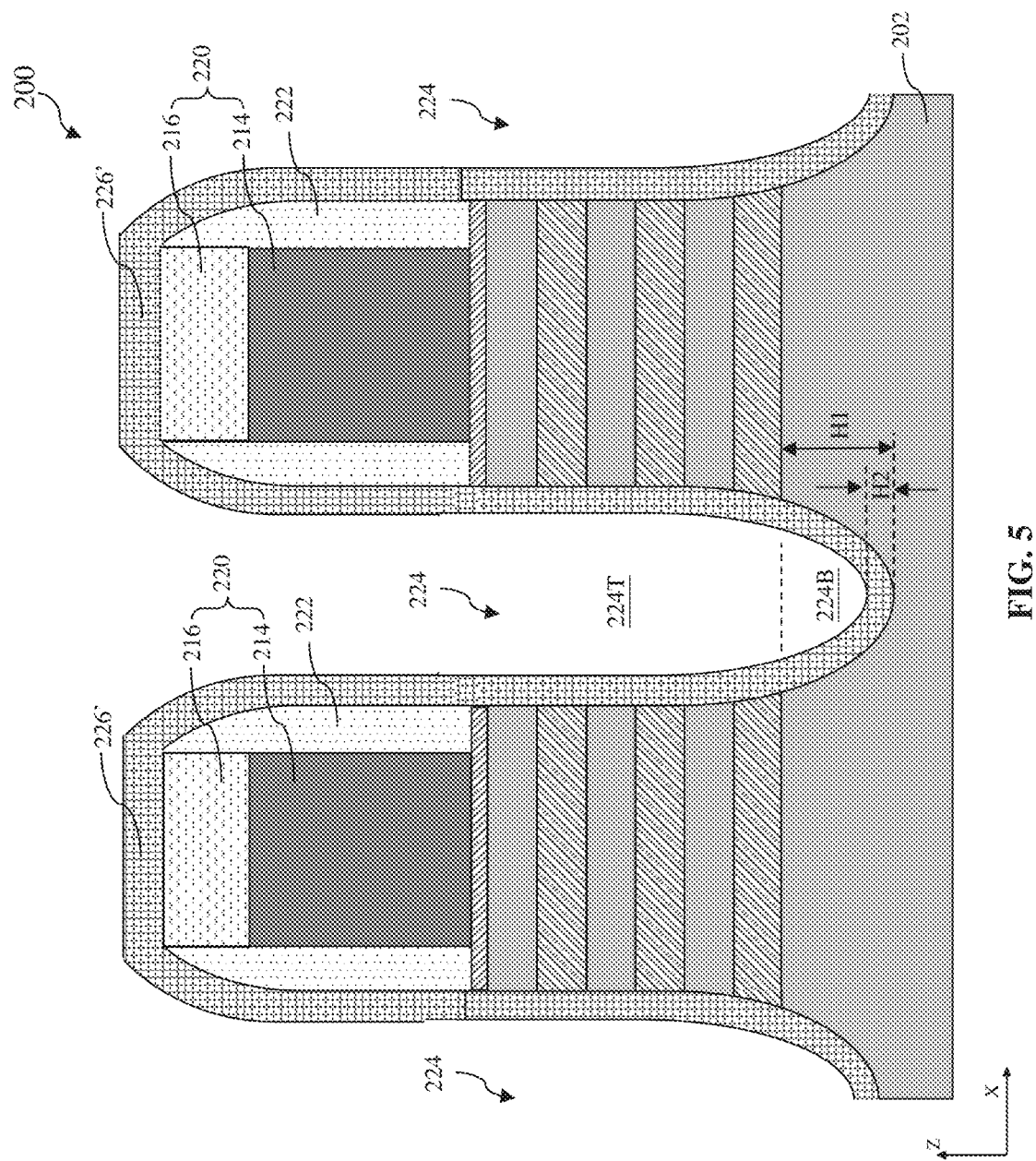

Now referring to FIGS. 1 and 5-8, at operation 1106, an isolation layer 226 is formed on the bottom surface of the S/D trenches 224. Formation of the isolation layer 226 includes various processes. Referring to FIG. 5, first, an isolation layer 226' is deposited over the dummy gate structures 220, along the sidewalls of the gate spacers 222 and in the S/D trenches 224. In some embodiments, the isolation layer 226' includes a dielectric material having a different selectivity from the gate hard mask 216 and the gate spacers 222. For example, the isolation layer 226' includes an isolation material such as SiO, SiN, aluminum oxide ($Al_2O_3$), other isolation material, or combinations thereof. The isolation layer 226' can be deposited by CVD, PVD, ALD, other suitable process, or combinations thereof. The isolation layer 226' has a thickness H2 over the bottom surface of the S/D trenches 224 (i.e. the exposed surface of the substrate 202 in the S/D trenches 224). In some embodiments, the thickness H2 is about 10% to about 50% of the height H1 of the bottom portion 224B of the S/D trench 224, such that the isolation layer is thin enough to leave enough space from the future formed S/D feature and is thick enough to ensure the isolation function over the recessed substrate portion in the S/D region. Otherwise, if the isolation layer is too thick (more than 50%), the air gap 244 between the isolation layer and the bulk S/D feature is small, and the unexpected parasitic capacitance may be increased; or if the isolation layer is too thin (less than 10%), it may be broken during the later etching process(es), thereby the S/D feature may be epitaxially grown from the substrate and cause the bulk leakage therebetween. In some further embodiments, the thickness H2 is about 1 nm to about 10 nm.

Figure 6:
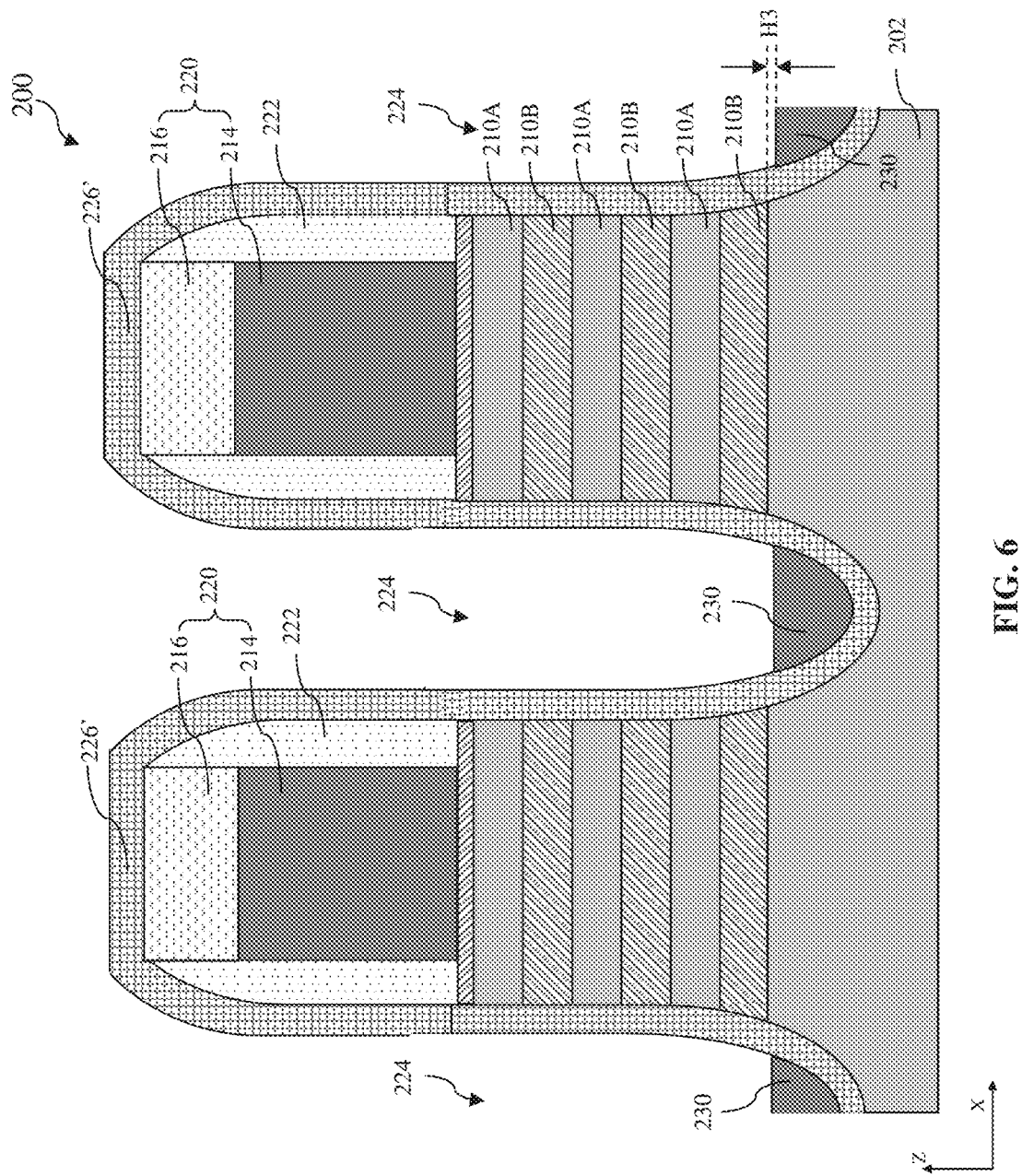

Referring to FIG. 6, buffer features 230 are formed over the isolation layer 226' in the bottom portion 224B of the S/D trenches 224. In some embodiments, the buffer features 230 include a suitable material for chamfering process. In some embodiments, the buffer features 230 include an organic dielectric material, such as plastics, graphite, and organic anti-reflective coating layers commonly used in lithographic processes. The formation of the buffer features 230 includes various processes. For example, first, an organic dielectric material is filled in the S/D trenches 224 (including the top portions 224T and the bottom portions 224B) by a deposition process or a spin on process. Thereafter, an etch back process is performed to the organic dielectric material to form the buffer features 230. The etch back process may include a wet etch, a dry etch, or combinations thereof. The height of the buffer features 230 will decide the height of the remained isolation layer 226 (referring to FIG. 7) covering the bottom surfaces of the S/D trenches 224 (i.e. exposed surface of the substrate 202) in the later epitaxy process. In some embodiments, the top surfaces of the buffer features 230 are substantially co-planar with the bottom surfaces of the lowermost semiconductor layers 210B, i.e. the top surface of the substrate 202. In some embodiments, as depicted in FIG. 6, the top surfaces of the buffer features 230 are below the bottom surfaces of the lowermost semiconductor layers 210B for a difference H3. In some embodiments, the difference H3 is about 1 nm to about 2 nm, which is about 5% to about 20% of the height H1 of the bottom portion 224B of the S/D trench 224, such that in later processes, the remained isolation layer 226 can block the substrate 202 from epitaxially growing the S/D features 240, as well as leave enough air gaps between the S/D features 240 and the lowermost inner spacers 228 and between the S/D features 240 and the substrate 202 (referring to FIG. 10). In other words, if the difference H3 is too much, the S/D feature may be epitaxially grown from the substrate, thereby cannot achieve the purpose of the present disclosure to reduce the bulk leakage between the bulk S/D feature and the substrate.

Figure 7:
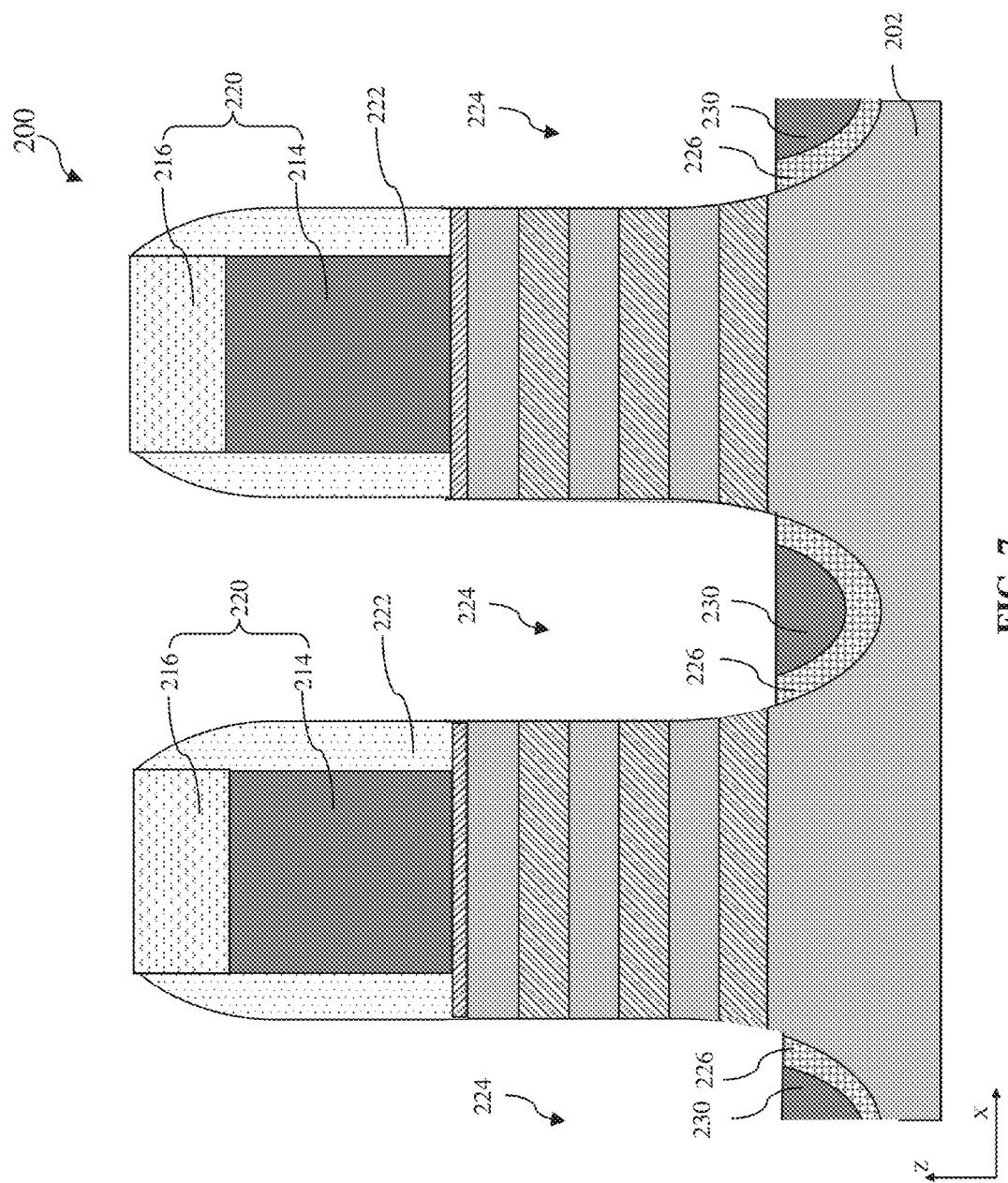

Referring to FIG. 7, top portions of the isolation layer 226' are removed, such that the remained bottom portions form the isolation layer 226 on the bottom surfaces of the S/D trenches 224. As depicted in FIG. 7, the top surface of the isolation layer 226 is substantial coplanar with the top surface of the buffer feature 230. The removal of the top portions of the isolation layers 226' includes an etching process, such as wet etch, dry etch, or combinations thereof. For example, in the case that the isolation layer 226' includes SiO, hydrofluoric acid (HF) is used in a wet etching process; or, carbon tetrafluoride ($CF_4$) with oxygen ($O_2$) or hydrogen ($H_2$) is used in a dry etching process.

Figure 8:
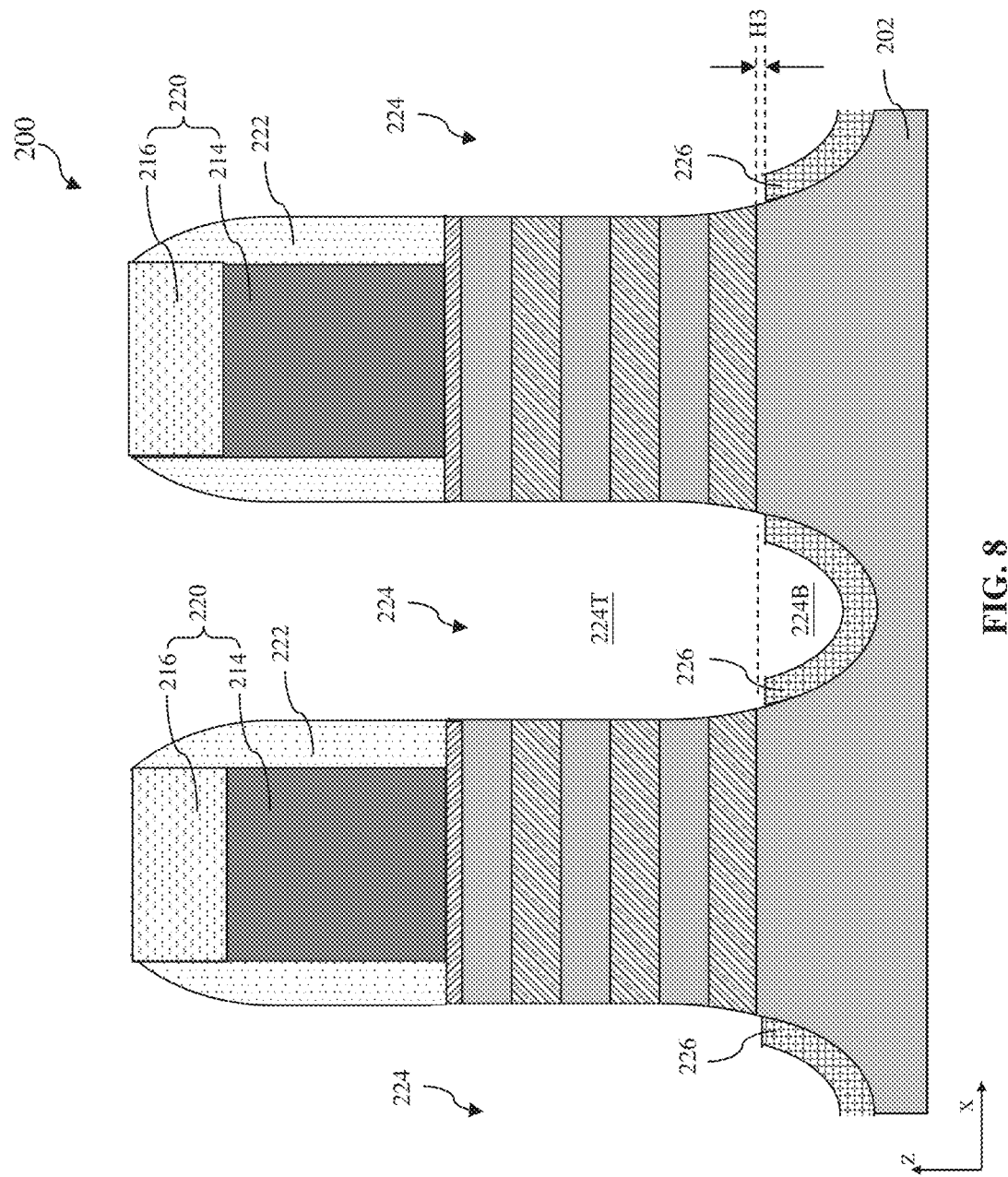

Referring to FIG. 8, the buffer features 230 are then removed using any suitable process. For a buffer feature including organic dielectric material, the removal may include an ashing process. For example, an oxygen or fluorine plasma is applied to combine with the buffer features 230 to form ash. And, the ash is then removed with a vacuum pump. Therefore, the buffer features 230 are removed, while the isolation layers 226 are remained on the bottom surface of the S/D trenches 224 and contact the recessed surface of the substrate 202 in the S/D region. As discussed above, a top surface of the isolation layer 226 is controlled by the height of the buffer feature 230. In some embodiments, the top surface of the isolation layer 226 is substantially coplanar with the bottom surface of the lowermost semiconductor layer 210B. In some embodiments, as depicted in FIG. 8, the top surface of the remained isolation layer 226 is below the bottom surface of the lowermost semiconductor layer 210B for a difference H3 (for example, about 1 nm to about 2 nm).

Figure 9:
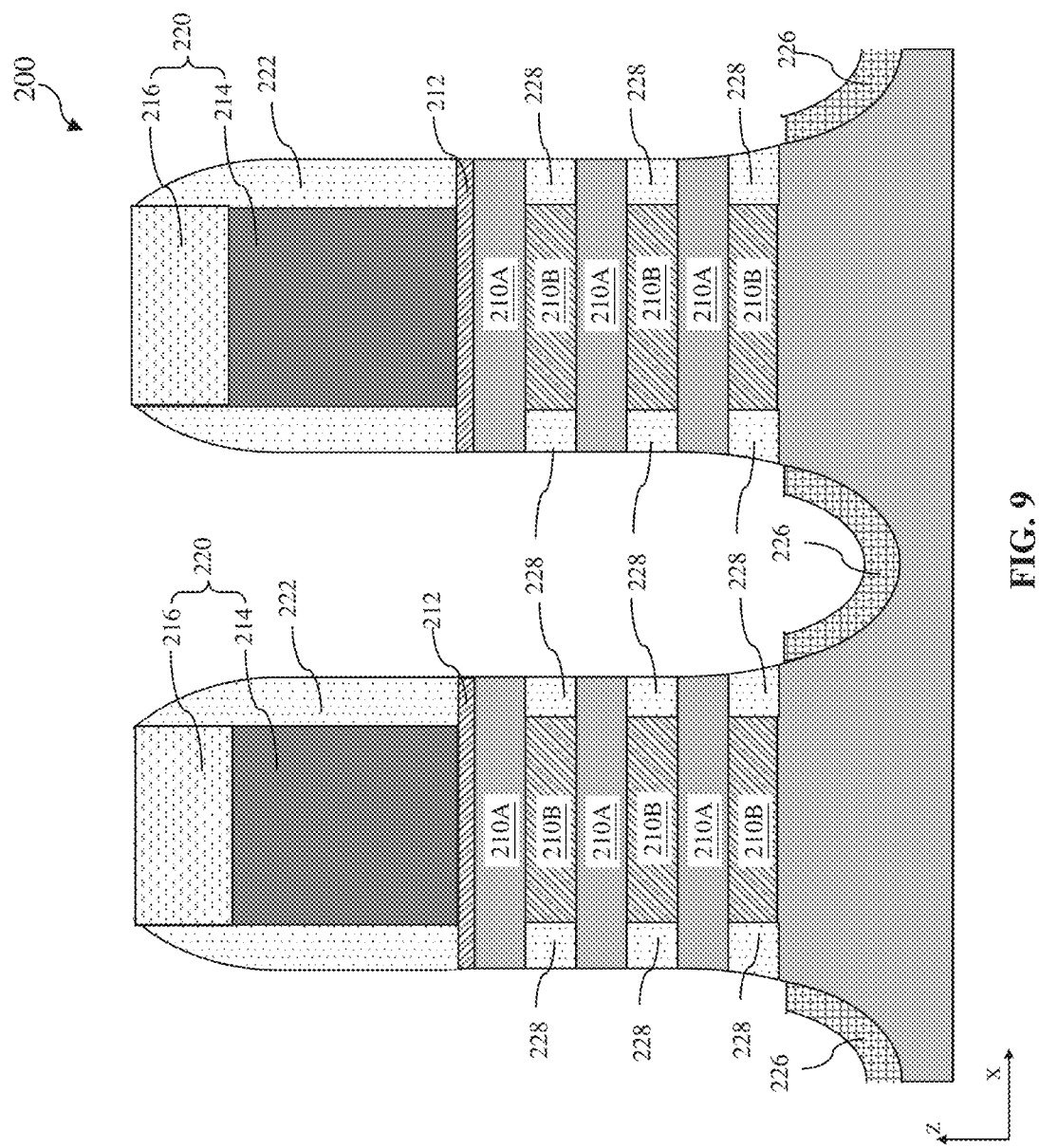

Now referring to FIGS. 1 and 9, at operation 1108, inner spacers 228 are formed between the edge portions of the semiconductor layers 210A. In some embodiments, the portions (edges) of the semiconductor layers 210B exposed in the S/D trenches 224 are selectively removed by a suitable etching process to form gaps between the edge portions of the semiconductor layers 210A. In other words, the edge portions of the semiconductor layers 210A are suspended in the S/D trenches 224. Due to the different oxidation rates and/or etching selectivities of the materials of the semiconductor layers 210A (for example, Si) and 210B (for example, SiGe), only exposed portions (edges) of the semiconductor layers 210B are removed, while the semiconductor layers 210A remain substantially unchanged. In some embodiments, the selective removal of the exposed portions of the semiconductor layers 210B may include an oxidation process followed by a selective etching process. For example, the edge portions of the semiconductor layers 210B are first selectively oxidized to include a material of SiGeO. Then, a selective etching process is performed to remove the SiGeO with a suitable etchant such as ammonium hydroxide ($NH_4OH$) or hydro fluoride (HF). The duration of the oxidation process and the selective etching process can be controlled such that only edge portions of the semiconductor layers 210B are selectively removed.

Thereafter, inner spacers 228 are formed to fill in the gaps between the semiconductor layers 210A. The inner spacers 228 comprise a dielectric material that is similar to the material of the gate spacers 222, such as SiO, SiN, SiON, SiC, or combinations thereof. The dielectric material of the inner spacers may be deposited in the S/D trenches 224 and in the gaps between the edges of the semiconductor layers 210A by CVD, PVD, ALD, or combinations thereof. Extra dielectric material is then removed along sidewalls of the gate spacers 222 until the sidewalls of the semiconductor layers 210A are exposed in the S/D trenches 224. The remained dielectric material between the edge portions of the semiconductor layers 210A forms the inner spacers 228.

Figure 10:
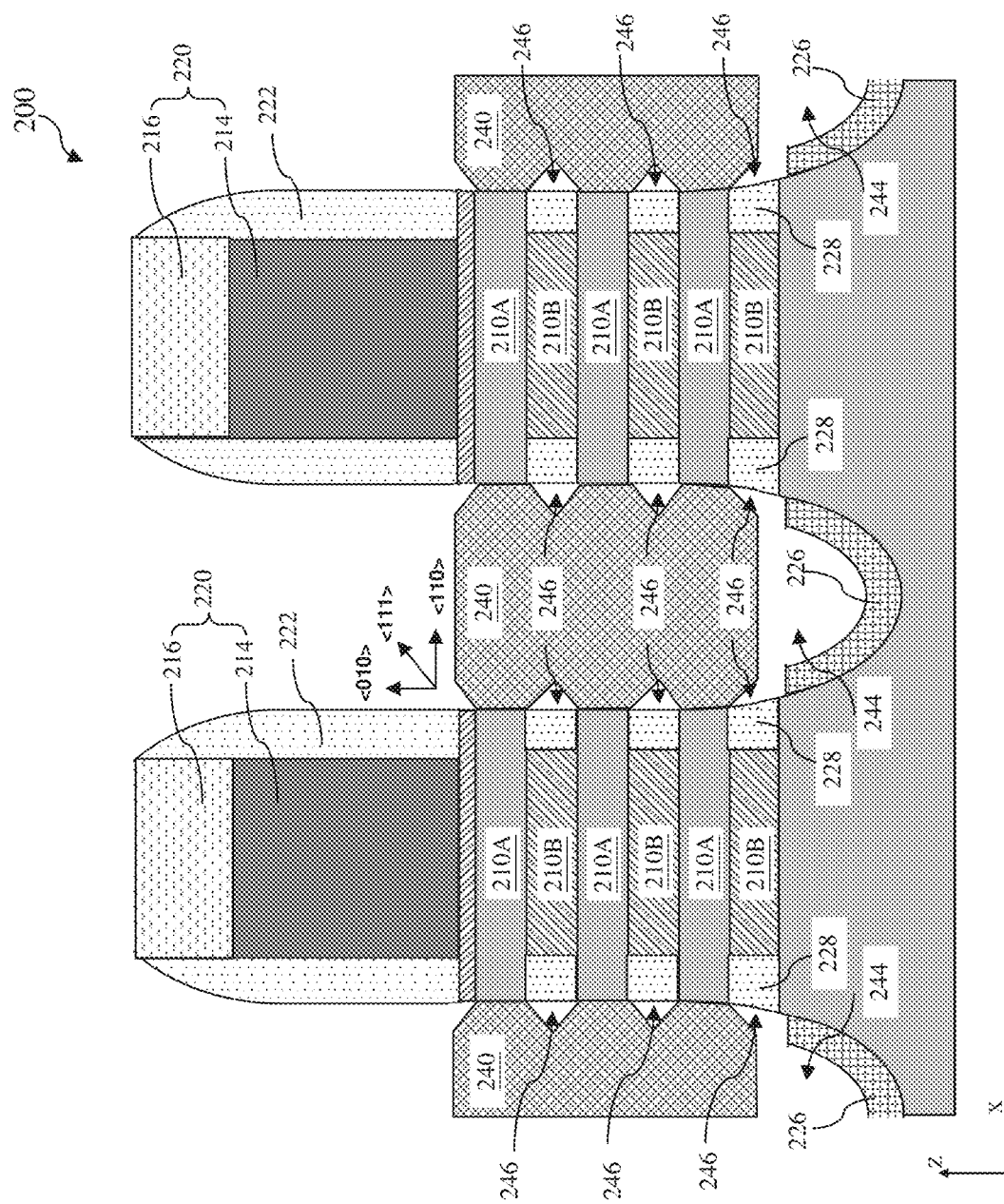
Figure 11:
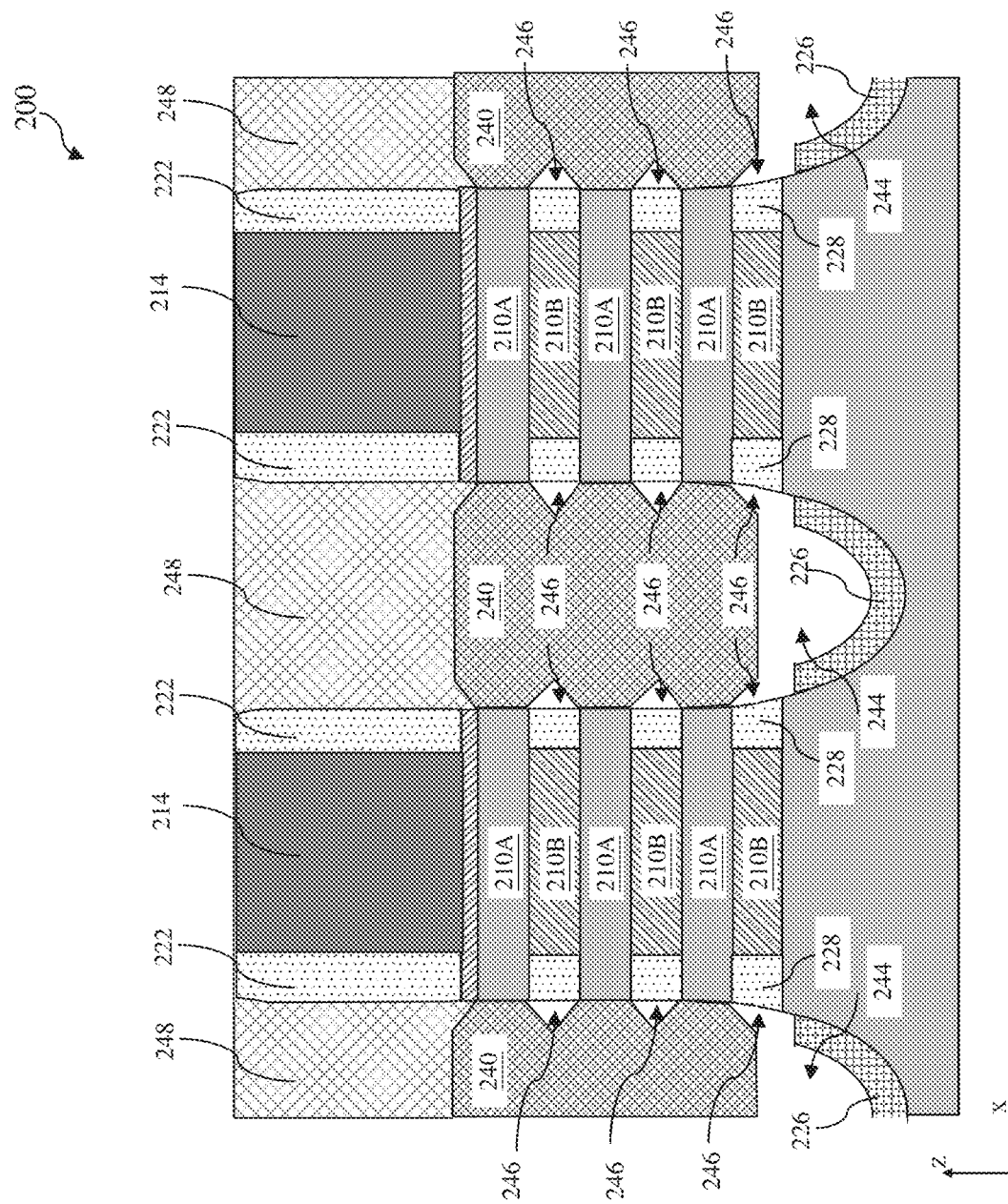

Now referring to FIGS. 1 and 10, at operation 1110, the S/D features 240 are epitaxially grown in the S/D trenches 224. In some embodiments, the S/D features 240 include a semiconductor material such as Si or Ge; a compound semiconductor such as SiGe, SiC, gallium arsenide (GaAs), etc.; an alloy semiconductor; or combinations thereof. The epitaxy process may comprise CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. As depicted in FIG. 10, the semiconductor material surfaces in the S/D trenches 224 are the exposed edge surfaces of the semiconductor layers 210A. The recessed surfaces of the substrate 202 in the S/D trenches 224 (i.e. the bottom surface of the S/D trenches 224) are covered by the isolation layer 226. Although tiny portions of the recessed surfaces of the substrate 202 may exposed in the S/D trenches 224 due to the difference H3, they are not large enough for crystalline layers to grow. Thus, the crystalline layers are epitaxially grown only from the exposed surfaces of the first semiconductor layers 210A. In the present disclosure, the crystalline lattices are epitaxially grown in the directions of <010> and <110>, to get the diagonal direction <111> from the silicon materials (i.e. the sidewalls of the semiconductor layers 210A) exposed in the S/D trenches 224. The epitaxy process period can be controlled such that the crystalline layers are merged along the Z-direction in the top portions 224T of the S/D trenches and is free in the bottom portions 224B of the S/D trenches. The merged crystalline layers form the bulk S/D features 240. Referring to FIG. 10, an air gap 244 is formed between the S/D feature 240 and the isolation layer 226 covering the recessed surfaces of the substrate 202, and air gaps 246 are formed between the S/D feature 240 and the inner spacers 228. In other words, the portion of the substrate 202 below the S/D feature is covered by the isolation layer 226, and thus the substrate 202 is separated from the S/D feature 240. And, the bulk S/D feature 240 includes facets along direction <111> forming the air gaps 246. The air gaps 246 may be in various shapes. For example, in FIG. 10, the air gaps 246 are isosceles triangle-shape in the X-Z plane. In some embodiments, the epitaxy process is controlled such that the tilt angle of the facet along direction <111> is about 45°±20° (i.e. within 40% of the 45° tilt angle) in the X-Z plane. The tilt angle cannot be too large, since it may cause the merging of the S/D feature 240 in the Z-direction and left no space for the air gap 246 and increase the unexpected capacitance. The tilt angle cannot be too small, since it may cause the bulk S/D feature 240 to be separated in the Z-direction.

In a convention nanosheet device, the recessed surface of the substrate is exposed in the S/D trenches, thus the S/D features are epitaxially grown not only from the exposed surfaces of the semiconductor layers, but also the exposed surface of the substrate. Therefore, the S/D feature directly contacts the substrate, thereby an undesired bulk leakage current Iboff may flow from the S/D feature to the substrate. However, in the present disclosure, the isolation layer 226 is formed to isolate the substrate, such that the S/D feature is not epitaxially grown from the recessed surface of the substrate, and an air gap is formed between the S/D features and the substrate. Therefore, the S/D Iboff leakage issue can be mitigated. In addition, the omission of S/D to substrate diode capacitance reduces charging and discharging time, thus the speed of the semiconductor device can be increased.

Now referring to FIGS. 1 and 11-13, at operation 1112, a metal gate replacement process is performed to replace the dummy gate structures 220 with metal gate structures 250. The metal gate replacement process includes various processing steps. For example, referring to FIG. 11, an interlayer dielectric (ILD) layer 248 is formed over the device 200. For example, the ILD layer 248 is disposed along the gate spacers 222 over the S/D features 240. In some embodiments, the ILD layer 248 comprises a low-k (K<3.9) dielectric material, such as tetraethylorthosilicate (TEOS), undoped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 248 may be formed by deposition processes such as CVD, flowable CVD (FCVD), spin-on-glass (SOG), other suitable methods, or combinations thereof. Thereafter, a planarization process (such as CMP) is performed to planarize the top portion of the device 200, including the gate hard mask 216, the gate spacers 222, and the ILD layer 248. In some embodiments, top portions of the dummy gate electrode 214 is also planarized.

Figure 12:
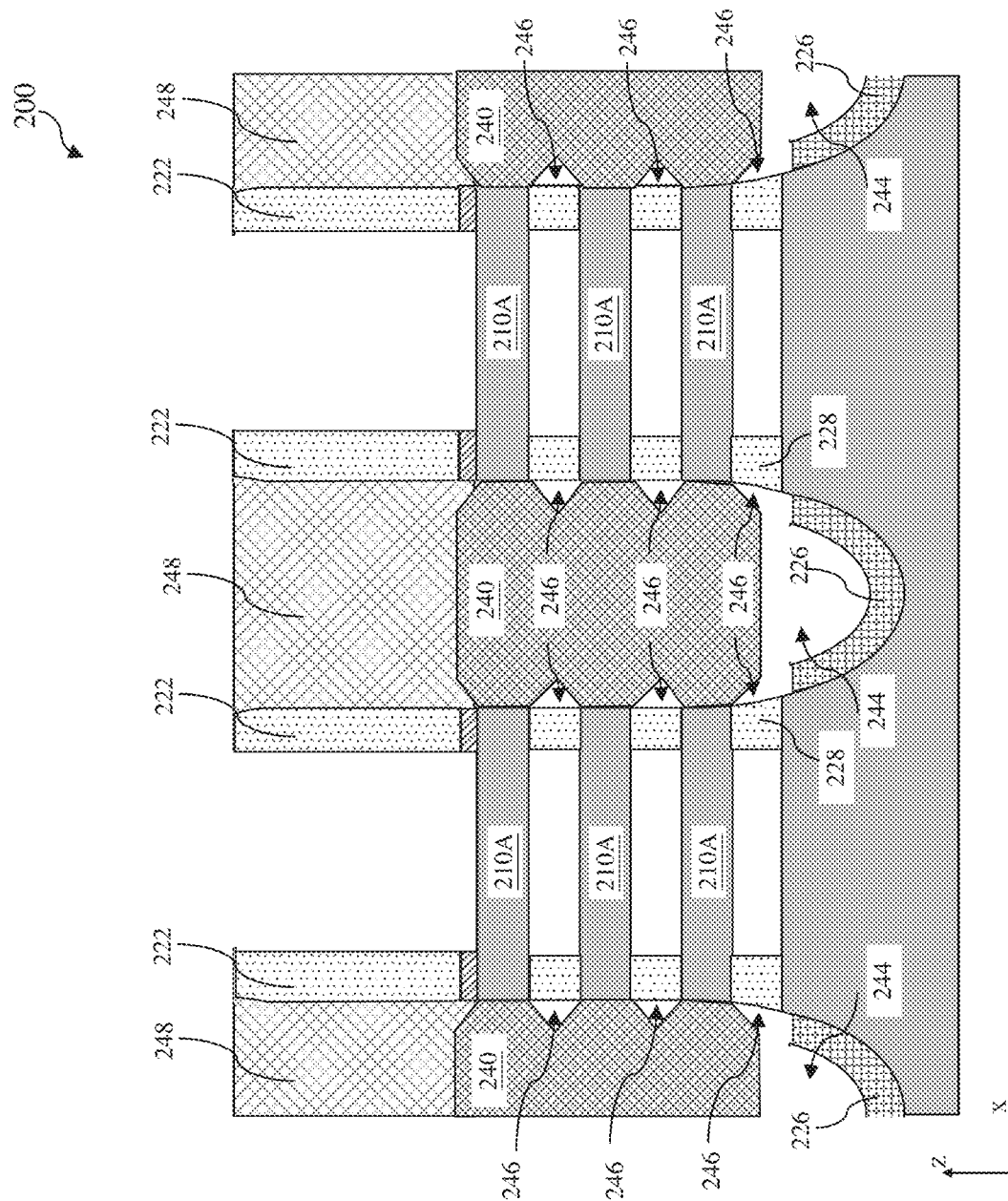

Referring to FIG. 12, the dummy gate structures 220 are then removed to form gate trenches exposing the channel regions of the stacks 210. In some embodiments, removing the dummy gate structures 220 comprises one or more etching processes, such as wet etching, dry etching, or other etching techniques. The semiconductor layers 210A and 210B are then exposed in the gate trenches. Subsequently, the semiconductor layers 210B are selectively removed from the gate trenches. Due to the different materials of the semiconductor layers 210A and 210B, the semiconductor layers 210B are removed by a selective oxidation/etching process similar as that to remove the edge portions of the semiconductor layers 210B. In some embodiments, the semiconductor layers 210A are slightly etched or not etched during the operation 1112. Thereby, the semiconductor layers 210A are suspended in the channel regions of the stacks 210 and stacked up along the direction (Z-direction) substantially perpendicular to the top surface of the substrate 202 (X-Y plane). The suspended semiconductor layers 210A are also referred to as channel semiconductor layers 210A.

Figure 13:
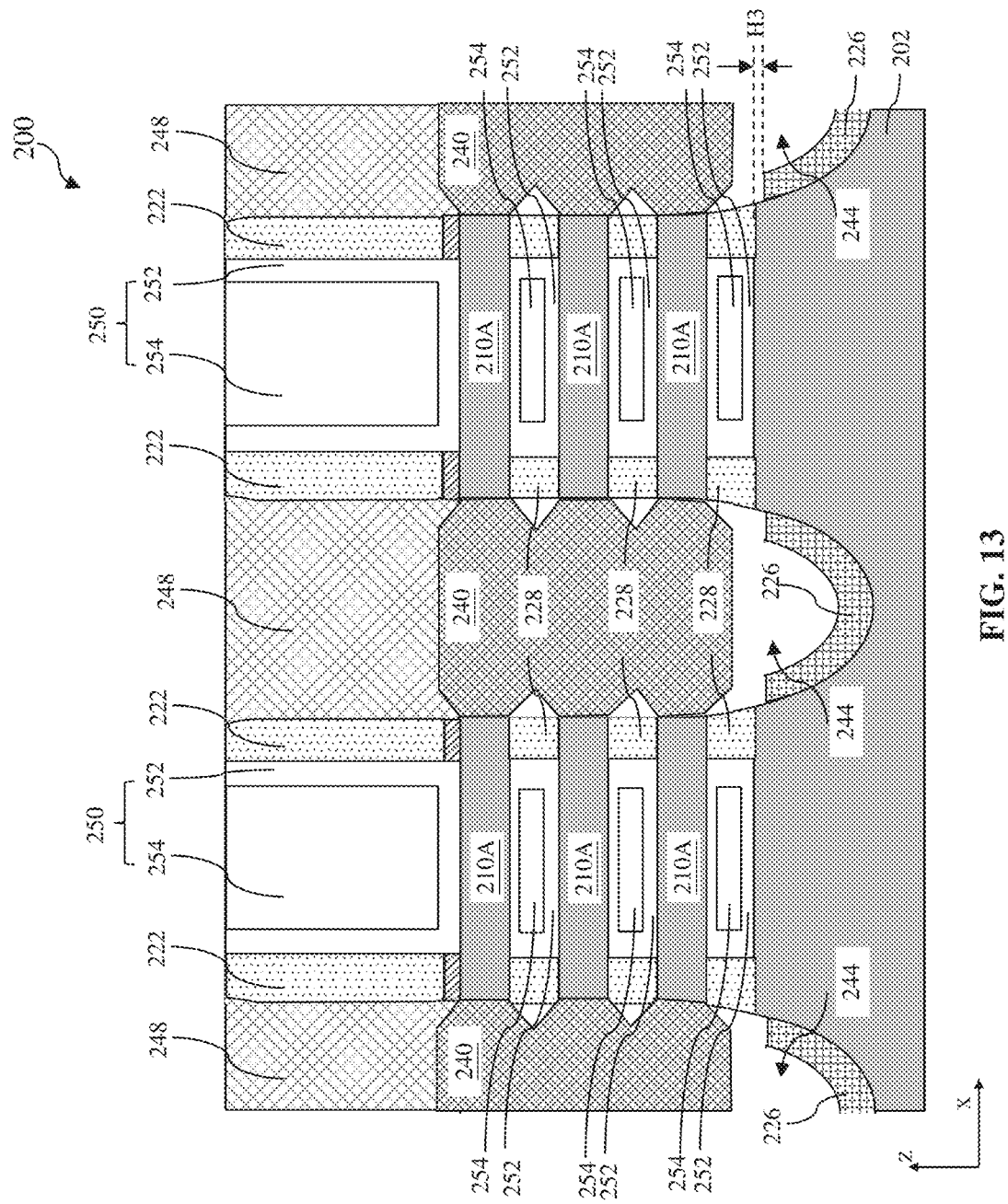

Thereafter, referring to FIG. 13, metal gate structures 250 are formed in the channel regions of the stacks 210. The metal gate structures 250 wrap each of the suspended semiconductor layers 210A. In some embodiments, each metal gate structure 250 may include a gate dielectric layer 252 wrapping around each of the channel semiconductor layers 210A, a metal gate electrode 254 over the gate dielectric layer 252, and other suitable layers. The gate dielectric layer 252 includes a high-k (K>3.9) dielectric material, such as HfO2, HfSiO, HfSiO4, HfSiON, HfLaO, HfTaO, HfTiO, HfZrO, HfAlOx, ZrO, ZrO$_2$, ZrSiO$_2$, AlO, AlSiO, Al$_2$O$_3$, TiO, TiO$_2$, LaO, LaSiO, Ta$_2$O$_3$, Ta$_2$O$_5$, Y$_2$O$_3$, SrTiO$_3$, BaZrO, BaTiO$_3$ (BTO), (Ba,Sr)TiO$_3$ (BST), Si$_3$N$_4$, hafnium dioxide-alumina (HfO$_2$—Al$_2$O$_3$) alloy, other suitable high-k dielectric material, or combinations thereof. In some embodiments, the gate dielectric layer 252 is deposited by CVD, PVD, ALD, and/or other suitable method. In some embodiments, each metal gate electrode 254 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrode 254 may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the device 200. Referring to FIG. 13, a bottom surface of the metal gate structure 250 is above a top surface of the isolation layer 226 for a difference H3 (for example, about 1 nm to about 2 nm).

In a conventional nanosheet device, the lowermost metal gate portion, the S/D features and the substrate can form a bottom single gate device. Each of the channel semiconductor layer are surrounded by the metal gate structure, and thereby form double gate devices. Compare with the double gate devices, the bottom single gate device is suffered with higher leakage current issue due to less gate control. However, in the present disclosure, the substrate is free of the S/D feature due to the protection of the isolation layer 226 and an air gap is formed between the S/D feature and the substrate. Thus, no bottom single gate device is formed, and the higher leakage current issue can be avoided. In addition, in the conventional nanosheet device, the S/D feature may physically contact the inner spacers around the metal gate. If the inner spacers are thin, high parasitic capacitance may occur between the S/D feature and the metal gate. However, in the present disclosure, air gaps are formed between the inner spacers and the S/D feature. Since air has the least absolute permittivity, the parasitic capacitance between the metal gate and the S/D feature can be reduced. Therefore, the performance of the semiconductor device is improved.

Figure 14:
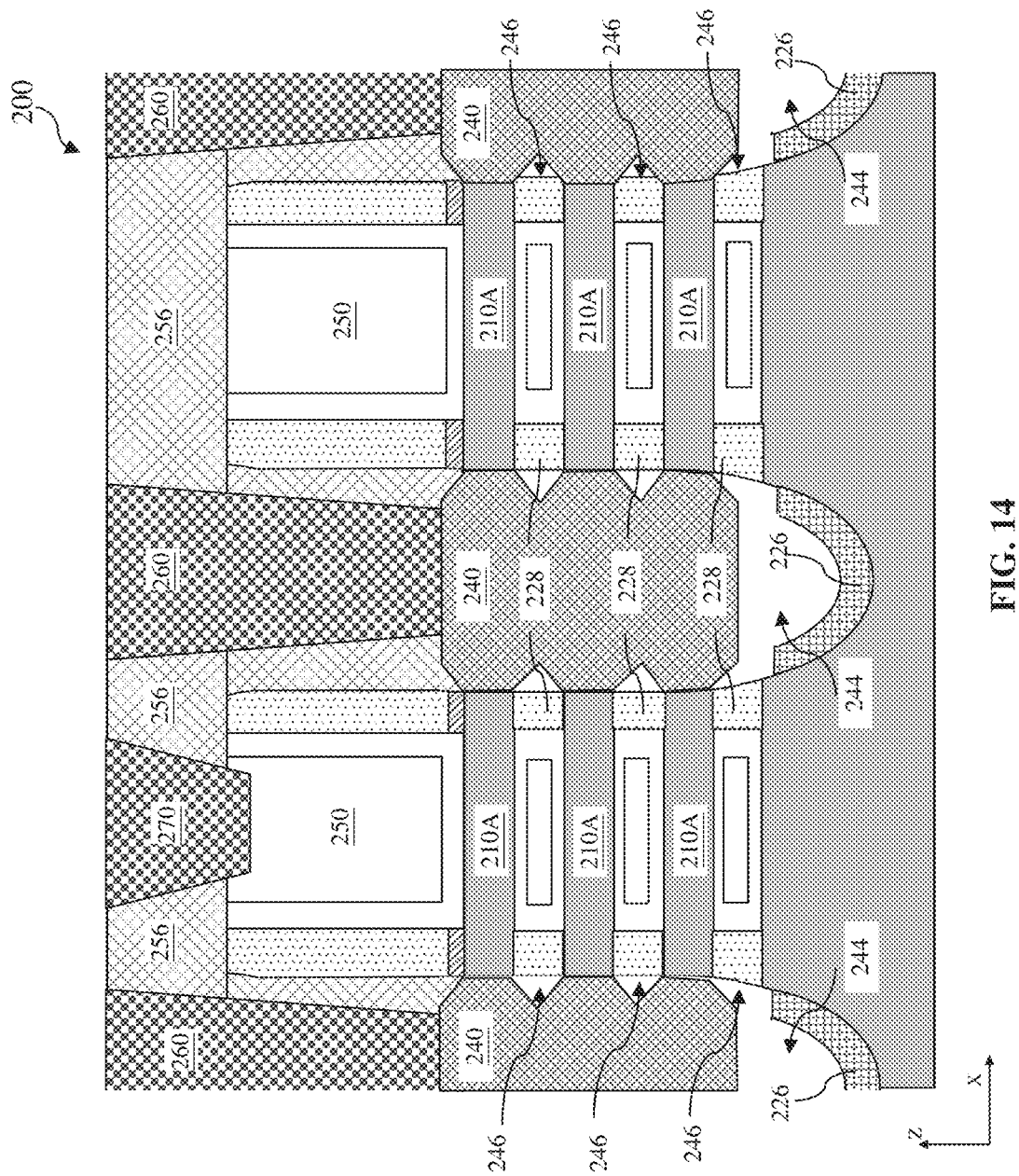

Now, referring to FIGS. 1 and 14, at operation 1114, further processing is performed to complete the fabrication of the device 200. For example, it may form various contacts/vias 260, 270, metal lines (not shown), as well as other multilayer interconnect features, such as ILD layers 256 and/or etch stop layer (ESLs, not shown) over the device 200, configured to connect the various features to form a functional circuit that comprises the different semiconductor devices.

Although not intended to be limiting, one or more embodiments of the present disclosure provide many benefits to a semiconductor device and a formation process thereof. For example, embodiments of the present disclosure provide a semiconductor device including an isolation layer formed on the bottom surface of the S/D trench. The isolation layer protects the recessed surface of the substrate such that the S/D features are only epitaxially grown from the surfaces of the channel semiconductor layers, and the substrate is separated from the S/D feature by an air gap and the isolation layer. Air gaps are also formed between the S/D feature and the inner spacers around the metal gate structure. Thereby, the S/D Iboff leakage path is cut off and the capacitance between the S/D feature and the metal gate structure can be reduced. In addition, no bottom single gate device is formed, thus the high leakage issue thereof can be mitigated. Therefore, the performance of the semiconductor device is improved.

The present disclosure provides for many different embodiments. Semiconductor device having S/D bottom isolation and methods of fabrication thereof are disclosed herein. An exemplary semiconductor device comprises first semiconductor stack over a substrate, wherein the first semiconductor stack includes first semiconductor layers separated from each other and stacked up along a direction substantially perpendicular to a top surface of the substrate; second semiconductor stack over the substrate, wherein the second semiconductor stack includes second semiconductor layers separated from each other and stacked up along the direction substantially perpendicular to the top surface of the substrate; inner spacers between edge portions of the first semiconductor layers and between edge portions of the second semiconductor layers; and a bulk source/drain (S/D) feature between the first semiconductor stack and the second semiconductor stack, wherein the bulk S/D feature is separated from the substrate by a first air gap, and the bulk S/D feature is separated from the inner spacers by second air gaps.

In some embodiments, the exemplary semiconductor device further comprises an isolation layer covering a portion of the substrate below the bulk S/D feature. In some embodiments, the first air gap is formed between the isolation layer and the bulk S/D feature. In some embodiments, the exemplary semiconductor device further comprises a metal gate structure wrapping each of the first semiconductor layers and each of the second semiconductor layers, wherein a bottom surface of the metal gate structure is above a top surface of the isolation layer. In some embodiments, a bottom surface of the metal gate structure is above a top surface of the isolation layer for about 1 nm to about 2 nm. In some embodiments, a thickness of the isolation layer is about 1 nm to about 10 nm. In some embodiments, the isolation layer includes a dielectric material.

A method of forming a semiconductor device comprises alternately forming first semiconductor layers and second semiconductor layers over a substrate, wherein the first semiconductor layers and the second semiconductor layers include different materials and are stacked up along a direction substantially perpendicular to a top surface of the substrate; forming dummy gate structures over the first and second semiconductor layers; forming a source/drain (S/D) trench along sidewalls of the dummy gate structures; forming an isolation layer on a bottom surface of the S/D trench; and forming a bulk S/D feature in the S/D trench, wherein the bulk S/D feature is separated from the isolation layer.

In some embodiments, the forming the isolation layer on the bottom surface of the S/D trench includes depositing a dielectric layer in the S/D trench; forming a buffer feature over a bottom portion of the S/D trench; removing a portion of the dielectric layer over the buffer feature to form the isolation layer; and removing the buffer feature. In some embodiments, the isolation layer includes a first dielectric material and the buffer feature includes a second dielectric material different from the first dielectric material. In some embodiments, the buffer feature includes an organic dielectric material. In some embodiments, a top surface of the buffer feature is below a bottom surface of a lowermost second semiconductor layer. In some embodiments, a thickness of the isolation layer is about 10% to about 50% of the bottom portion of the S/D trench.

In some embodiments, the exemplary method further comprises selectively removing edge portions of the second semiconductor layers from the S/D trench; and forming inner spacers to fill in the removed edge portions of the second semiconductor layers. In some embodiments, the forming the bulk S/D feature in the S/D trench includes epitaxially growing semiconductor material between the first semiconductor layers in the S/D trench, wherein the semiconductor material is merged to form the bulk S/D feature. In some embodiments, the bulk S/D feature and the inner spacers are separated by air gaps.

Another exemplary method comprises alternately forming first semiconductor layers and second semiconductor layers over a substrate, wherein the first semiconductor layers and the second semiconductor layers include different materials and are stacked up along a direction substantially perpendicular to a top surface of the substrate; forming dummy gate structures over channel regions of the first and second semiconductor layers; removing a S/D region of the first and second semiconductor layers to form a source/drain (S/D) trench, such that the first semiconductor layers and the second semiconductor layers are truncated by the S/D trench and a recessed surface of the substrate is exposed in the S/D trench; forming an isolation layer covering the recessed surface of the substrate exposed in the S/D trench; and epitaxial growing semiconductor material between the truncated first semiconductor layers to form a bulk S/D feature.

In some embodiments, the forming the isolation layer covering the recessed surface of the substrate exposed in the S/D trench includes depositing a dielectric layer along sidewalls of the S/D trench and on the recessed surface of the substrate; depositing an organic material over the dielectric layer; etching back the organic material to form a buffer feature, wherein a top surface of the buffer feature is below a bottom surface of a lowermost second semiconductor layer; removing a portion of the dielectric layer over the buffer feature to form the isolation layer; and removing the buffer feature.

In some embodiments, the exemplary method further comprises forming inner spacers between edge regions of the first semiconductor layers, wherein the inner spacers are separated from the bulk S/D feature by air gaps.

In some embodiments, the exemplary method further comprises selectively removing the second semiconductor layers; replacing the dummy gate structures with metal gate structures, wherein a bottom surface of the metal gate structures is above a top surface of the isolation layer; and forming a contact feature contacting the bulk S/D feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor stack over a substrate, wherein the first semiconductor stack includes first semiconductor layers separated from each other and stacked up along a direction substantially perpendicular to a top surface of the substrate;
   a second semiconductor stack over the substrate, wherein the second semiconductor stack includes second semiconductor layers separated from each other and stacked up along the direction substantially perpendicular to the top surface of the substrate;
   inner spacers between edge portions of the first semiconductor layers and between edge portions of the second semiconductor layers;

a bulk source/drain (S/D) feature between the first semiconductor stack and the second semiconductor stack, wherein the bulk S/D feature is separated from the substrate by a first air gap, and the bulk S/D feature is separated from the inner spacers by second air gaps;
a first gate spacer disposed over the first semiconductor stack;
a second gate spacer disposed over the second semiconductor stack;
a first dielectric layer disposed over the bulk S/D feature and sandwiched between the first gate spacer and the second gate spacer;
a metal gate structure wrapping each of the first semiconductor layers and each of the second semiconductor layers;
a second dielectric layer disposed over the first gate spacer, the second gate spacer and the first dielectric layer; and
an isolation layer covering a portion of the substrate below the bulk S/D feature,
wherein a top surface of the isolation layer is lower than a lowermost one of the first semiconductor layers,
wherein a bottom surface of the metal gate structure is above a top surface of the isolation layer by about 1 nm to about 2 nm.

2. The semiconductor device of claim 1, wherein the isolation layer includes a dielectric material having an etch selectivity different from that of the first gate spacer or the second gate spacer.

3. The semiconductor device of claim 1, wherein the first air gap is formed between the isolation layer and the bulk S/D feature.

4. The semiconductor device of claim 1, wherein a thickness of the isolation layer is about 1 nm to about 10 nm.

5. The semiconductor device of claim 1, further comprising:
a source/drain contact via extending through the second dielectric layer and the first dielectric layer to electrically couple to the bulk S/D feature.

6. The semiconductor device of claim 1, further comprising:
a liner sandwiched between the first gate spacer and a topmost one of the first semiconductor layers.

7. The semiconductor device of claim 6, wherein the liner comprises silicon oxide or silicon nitride.

8. A method of forming a semiconductor device, comprising:
alternately forming first semiconductor layers and second semiconductor layers over a substrate, wherein the first semiconductor layers and the second semiconductor layers include different materials and are stacked up along a direction substantially perpendicular to a top surface of the substrate;
depositing a dielectric liner over a topmost first semiconductor layer of the first semiconductor layers;
after the depositing of the dielectric liner, forming dummy gate structures over the first and second semiconductor layers;
forming a source/drain (S/D) trench along sidewalls of the dummy gate structures;
forming an isolation layer on a bottom surface of the S/D trench; and
forming a bulk S/D feature in the S/D trench, wherein the bulk S/D feature is separated from the isolation layer, wherein the forming the isolation layer on the bottom surface of the S/D trench includes:
depositing a dielectric layer in the S/D trench,
forming a buffer feature over a bottom portion of the S/D trench,
removing a portion of the dielectric layer over the buffer feature to form the isolation layer, and
removing the buffer feature.

9. The method of claim 8, wherein the isolation layer includes a first dielectric material and the buffer feature includes a second dielectric material different from the first dielectric material.

10. The method of claim 9, wherein the buffer feature includes an organic dielectric material.

11. The method of claim 8, wherein a top surface of the buffer feature is below a bottom surface of a lowermost second semiconductor layer.

12. The method of claim 8, wherein a thickness of the isolation layer is about 10% to about 50% of the bottom portion of the S/D trench.

13. The method of claim 8, further comprising:
selectively removing edge portions of the second semiconductor layers from the S/D trench; and
forming inner spacers to fill in the removed edge portions of the second semiconductor layers.

14. The method of claim 13, wherein the forming the bulk S/D feature in the S/D trench includes:
epitaxially growing semiconductor material between the first semiconductor layers in the S/D trench, wherein the semiconductor material is merged to form the bulk S/D feature.

15. The method of claim 14, wherein the bulk S/D feature and the inner spacers are separated by air gaps.

16. The method of claim 8, wherein the removing of the buffer feature comprises use of an ashing process.

17. A method of forming a semiconductor device, comprising:
alternately forming first semiconductor layers and second semiconductor layers over a substrate, wherein the first semiconductor layers and the second semiconductor layers include different materials and are stacked up along a direction substantially perpendicular to a top surface of the substrate;
depositing a dielectric liner over a topmost first semiconductor layer of the first semiconductor layers;
after the depositing of the dielectric liner, forming dummy gate structures over channel regions of the first and second semiconductor layers;
removing a S/D region of the first and second semiconductor layers to form a source/drain (S/D) trench, such that the first semiconductor layers and the second semiconductor layers are truncated by the S/D trench and a recessed surface of the substrate is exposed in the S/D trench;
forming an isolation layer covering the recessed surface of the substrate exposed in the S/D trench; and
epitaxial growing semiconductor material between the truncated first semiconductor layers to form a bulk S/D feature,
wherein the forming the isolation layer covering the recessed surface of the substrate exposed in the S/D trench includes:
depositing a dielectric layer along sidewalls of the S/D trench and on the recessed surface of the substrate,
depositing an organic material over the dielectric layer,
etching back the organic material to form a buffer feature, wherein a top surface of the buffer feature is below a bottom surface of a lowermost second semiconductor layer, removing a portion of the dielectric layer over the buffer feature to form the isolation layer, and removing the buffer feature.

18. The method of claim 17, further comprising:

forming inner spacers between edge regions of the first semiconductor layers, wherein the inner spacers are separated from the bulk S/D feature by air gaps.

19. The method of claim 17, further comprising:

selectively removing the second semiconductor layers;

replacing the dummy gate structures with metal gate structures, wherein a bottom surface of the metal gate structures is above a top surface of the isolation layer; and forming a contact feature contacting the bulk S/D feature.

20. The method of claim 17, wherein the depositing of the dielectric layer comprises use of CVD, PVD or ALD, wherein the depositing of the organic material comprises use of spin-on coating.

\* \* \* \* \*